United States Patent
Tsai

(10) Patent No.: US 7,513,298 B2
(45) Date of Patent: Apr. 7, 2009

(54) COOLING ELEMENT FOR ELIMINATING ELECTROMAGNETIC NOISE

(75) Inventor: Wei-Hung Tsai, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 347 days.

(21) Appl. No.: 11/334,376

(22) Filed: Jan. 19, 2006

(65) Prior Publication Data

US 2007/0163763 A1 Jul. 19, 2007

(51) Int. Cl.
*F28F 7/00* (2006.01)
*H05K 7/20* (2006.01)
*H01L 23/34* (2006.01)

(52) U.S. Cl. ............... 165/185; 165/80.3; 361/704; 257/722

(58) Field of Classification Search ............ 165/185, 165/80.3; 361/704; 257/722
See application file for complete search history.

(56) References Cited

U.S. PATENT DOCUMENTS 3,572,428 A * 3/1971 Monaco ............. 165/80.3
3,893,161 A * 7/1975 Pesak, Jr. ............ 257/718
4,689,720 A * 8/1987 Daszkowski ........... 361/704
6,189,601 B1 * 2/2001 Goodman et al. ........ 165/80.3
7,286,361 B2 * 10/2007 Yamanaka ............ 361/704
2002/0131238 A1 * 9/2002 Fisher et al. ........... 361/719
2003/0150604 A1 * 8/2003 Koning et al. .......... 165/185

* cited by examiner

*Primary Examiner*—Cheryl J Tyler
*Assistant Examiner*—Brandon M Rosati
(74) *Attorney, Agent, or Firm*—WPAT. P.C.; Justin King

(57) ABSTRACT

The present invention is to provide a cooling element for eliminating electromagnetic noise, which is formed by bending a plate into a symmetric structure symmetrically comprising a contact part being in connect with an electronic component to absorb heat and noise radiated therefrom; an extension part having one end connected with said contact part to absorb heat and noise from said contact part; and a dissipation part connected with the other end of said extension part to absorb heat and noise from said extension part; wherein the noises absorbed by the cooling element are transmitted along the paths among the contact part, extension part and the dissipation part, and are mutually offset with each other in accordance with the symmetric structure thereof.

7 Claims, 7 Drawing Sheets

COOLING ELEMENT FOR ELIMINATING ELECTROMAGNETIC NOISE

FIELD OF THE INVENTION

The present invention generally relates to a cooling fin, and more particularly to a cooling element formed by bending a plate into a symmetric structure for eliminating electromagnetic noise.

BACKGROUND OF THE INVENTION

In general, the structure designs of conventional cooling fins can be roughly classified into two categories, wherein one belongs to bar-type cooling fin applicable to medium and large machine (e.g. desktop computer) and the other one belongs to over-head cooling plate applicable to small machine (e.g. notebook computer). The bar-type cooling fin is illustrated in FIG. 1, the bar-type cooling fin 10 comprises a metal base board 11 having one side for contacting with an electronic component (e.g. CPU) and the other side thereof with a plurality of bar-type fins 12 arranged in a form of an array. As such, when the metal base board 11 receives heat conducted from the electronic component, the metal base board 11 will then conduct the heat to the bar-type fins 12 so that the total heat energy of the metal base board 11 can be distributed to the bar-type fins 12 and further dissipated to the air so as to reduce the heat of the electronic component.

In addition, please refer to the over-head cooling plate as shown in FIG. 2. The over-head cooling plate 13 is composed of a metal plate 14. Both free ends of the metal plate 14 rise up a height and then oppositely extend therefrom a length horizontally to form a contact surface 15 respectively such that the over-head cooling plate 13 is formed as a "T" shape. The two contact surfaces 15 are coupled with the inner side of the case of the small machine. Therefore, when the metal plate 14 receives heat conducted from the electronic component, the metal plate 14 can conduct the heat thereof to the case via the two contact surfaces 15 to reduce the heat of the electronic component.

Whereas, when a regular electronic component is operating, it will generate electromagnetic noise and radiate it to the ambient environment. Such noise can be further transmitted to a circuit board and another electronic component (e.g. graphics chip) or transmitted along the radial paths inside the case. In general, since the regular cooling plate is made of metal material, the heat of the cooling plate and the electronic component can be mutually coupled when the cooling plate contacts with the electronic component, allowing the electromagnetic noise of the electronic component to be transmitted to the cooling plate. Besides, the cooling plate can also be treated as an antenna to absorb the noise transmitted along radial directions inside the case.

Since the cooling plate can also be used as an antenna, the noise absorbed by the cooling plate can be radiated to the ambient environment. Furthermore, by means of the energy coupling between electronic components, the noise will eventually be transmitted back to the electronic component. Therefore, how to design a structure of cooling plate capable of eliminating the electromagnetic noise is a crucial subject needed to be resolved currently.

SUMMARY OF THE INVENTION

Owing to all the shortcomings resulting from the aforementioned cooling fin design, the inventor of the present invention, in accordance with years of technical experience and accumulated professional knowledge, targets the shortcomings and finally develops a cooling element for eliminating electromagnetic noise.

In accordance with the first aspect of the invention, a cooling element for eliminating electromagnetic noise is provided. The cooling element is formed by bending a plate into a structure symmetrically comprising a contact part, an extension part and a dissipation part, wherein both free ends of the plate rise up a height and then extend horizontally therefrom a length along face-to-face directions so as to form the contact part, both free ends further rise up therefrom to form the extension part, and after rising up a height both free ends extend horizontally therefrom a length along back-to-back directions to form the dissipation part.

In accordance with the second aspect of the invention, when the cooling element is in contact with an electronic component to absorb heat, electromagnetic noise radiated from the electronic component and the radiated electromagnetic noise existing in the ambient environment, the heat is dissipated by means of the dissipation part of the cooling element and the electromagnetic noises are eliminated by means of the symmetric structure of the cooling element while the electromagnetic noises being transmitted along the paths between the contact part and the dissipation part are mutually offset from each other in accordance with the electromagnetic differential theory.

The above and other objects, features and advantages of the present invention will become apparent from the following detailed description taken with the accompanying drawings.

DETAILED DESCRIPTION OF THE PREFERRED EMBODIMENTS

Figure 1:
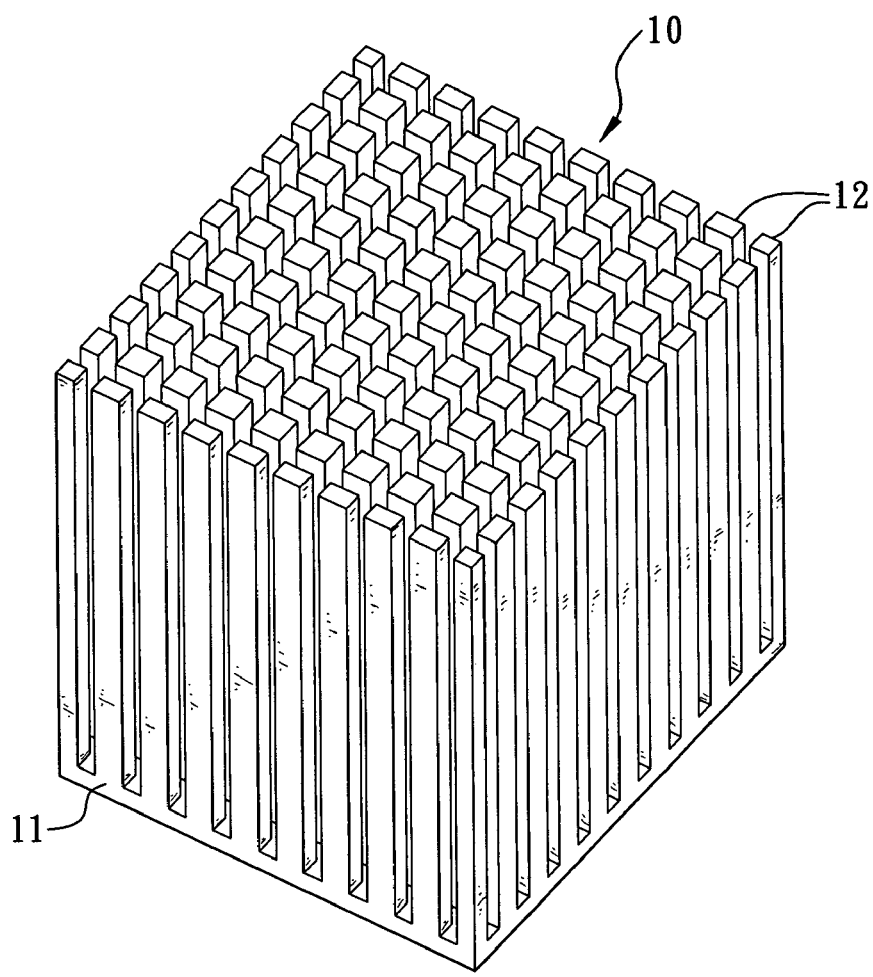
FIG. 1 is a perspective view of the conventional bar-type cooling fins.
Figure 2:
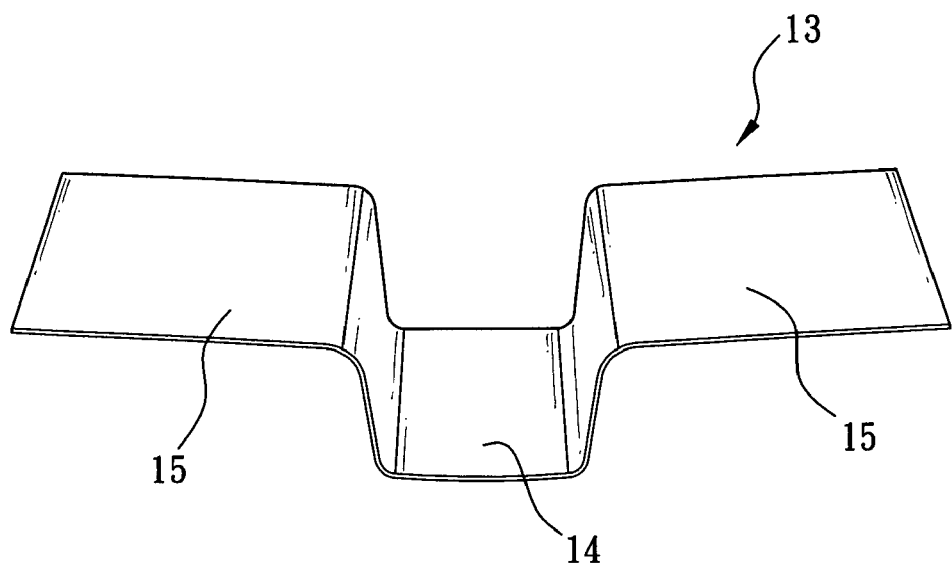
FIG. 2 is a perspective view of the conventional over-head cooling plate.
Figure 3A:
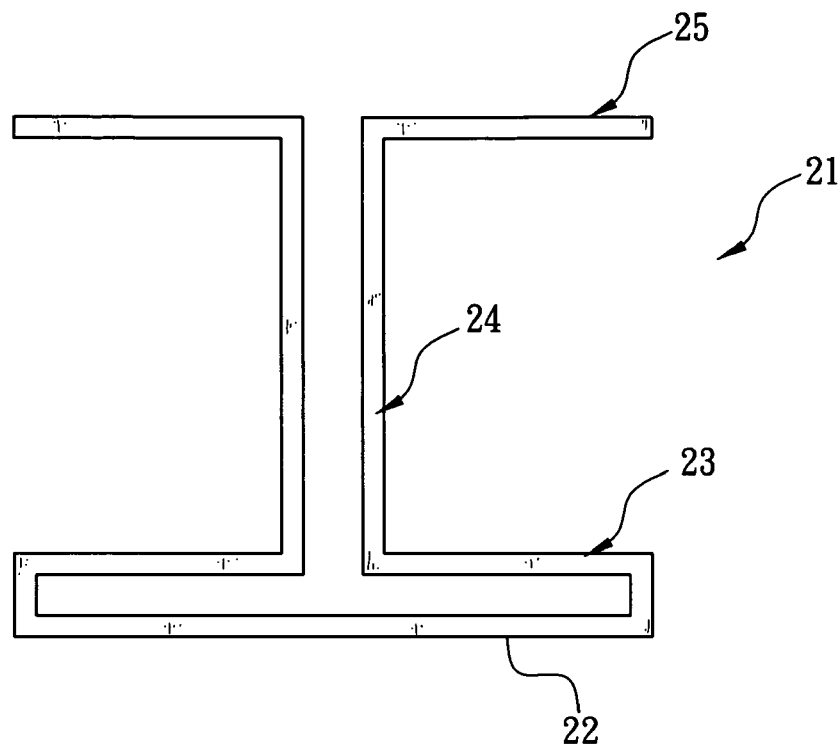
FIG. 3a is a schematic view of a cooling element in the first preferred embodiment of the present invention.
Figure 3B:
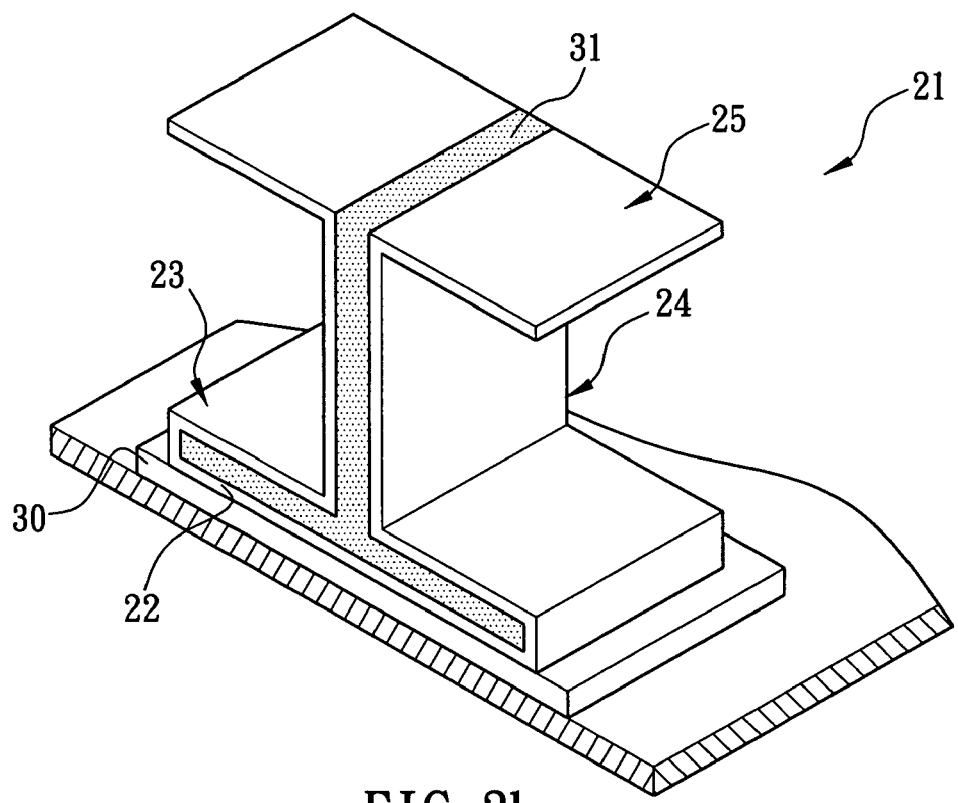
FIG. 3b is a perspective view of the cooling element.

The invention is to provide a cooling element for eliminating electromagnetic noise. As shown in FIG. 3a and FIG. 3b, the cooling element 21 is formed by bending a plate 22 into a symmetric structure, which symmetrically includes a contact part 23, an extension part 24 and a dissipation part 25, wherein the contact part 23 is in contact with an electronic component 30 (e.g. CPU) to absorb the heat and noise (or called electromagnetic noise) radiated from the electronic component and transfer the heat and noise to the extension part 24 located between the contact part 23 and the dissipation part 25, the heat in the extension part 24 is then conducted to the dissipation part 25 and dissipates to the air or to a case (e.g. inner side of notebook computer case) in contact with the dissipation part 25, and the noises absorbed by the cooling element 21 are transmitted along the paths among the contact part 23, the extension part 24 and the dissipation part 25 and are mutually offset from each other in accordance with the electromagnetic differential theory so as to eliminate the electromagnetic noises by means of the symmetric structure design of the cooling element 21.

Moreover, please refer to FIG. 3a again. With respect to different noises, the cooling element 21 can be designed into different structures by altering the length of the plate 22 and/or the bending angle of the plate 22 for achieving the objective of absorbing the noises expected to be eliminated. The capability of absorbing noise by the cooling element 21 depends on the material, length and structure of the plate 22. Besides, the cooling element 21 can also function as an antenna to absorb the radiated noises in the ambient environment by means of the structural design among the contact part 23, the extension part 24 and the dissipation part 25, and allow the radiated noises to be transmitted along the paths among the contact part 23, the extension part 24 and the dissipation part 25 and are mutually offset from each other in accordance with the electromagnetic differential theory.

Please refer to FIG. 3a illustrating a cooling element 21 according to a first preferred embodiment of the present invention, wherein both free ends of a plate 22 rise up a height and then horizontally extend a length to confront each other so as to form the contact part 23, both free ends further rise up another height to form the extension part 24, and both free ends then horizontally extend a length to depart from each other so as to form the dissipation part 25, such that the cooling element 21 is formed as a symmetric structure having an "I" shaped cross section.

Please refer to FIG. 3b illustrating a perspective view of the cooling element 21. When one side of the contact part 23 facing oppositely to the extension part 24 is in contact with an electronic component 30, the contact part 23 absorbs the heat conducted from the electronic component 30, the noise radiated from the electronic component 30 and the radiated noise existing in the ambient environment. The heat is transferred along the path of the contact part 23, the extension part 24 and the dissipation part 25 sequentially for dissipating to the air or to a case (e.g. inner side of notebook computer case) in contact with the dissipation part 25. The noises absorbed by the cooling element 21 are transmitted along the paths among the contact part 23, the extension part 24 and the dissipation part 25 and are mutually offset from each other in accordance with the electromagnetic differential theory by virtue of the symmetric structural design of the cooling element 21 so as to achieve the objectives of absorbing and eliminating the electromagnetic noises.

Figure 3C:
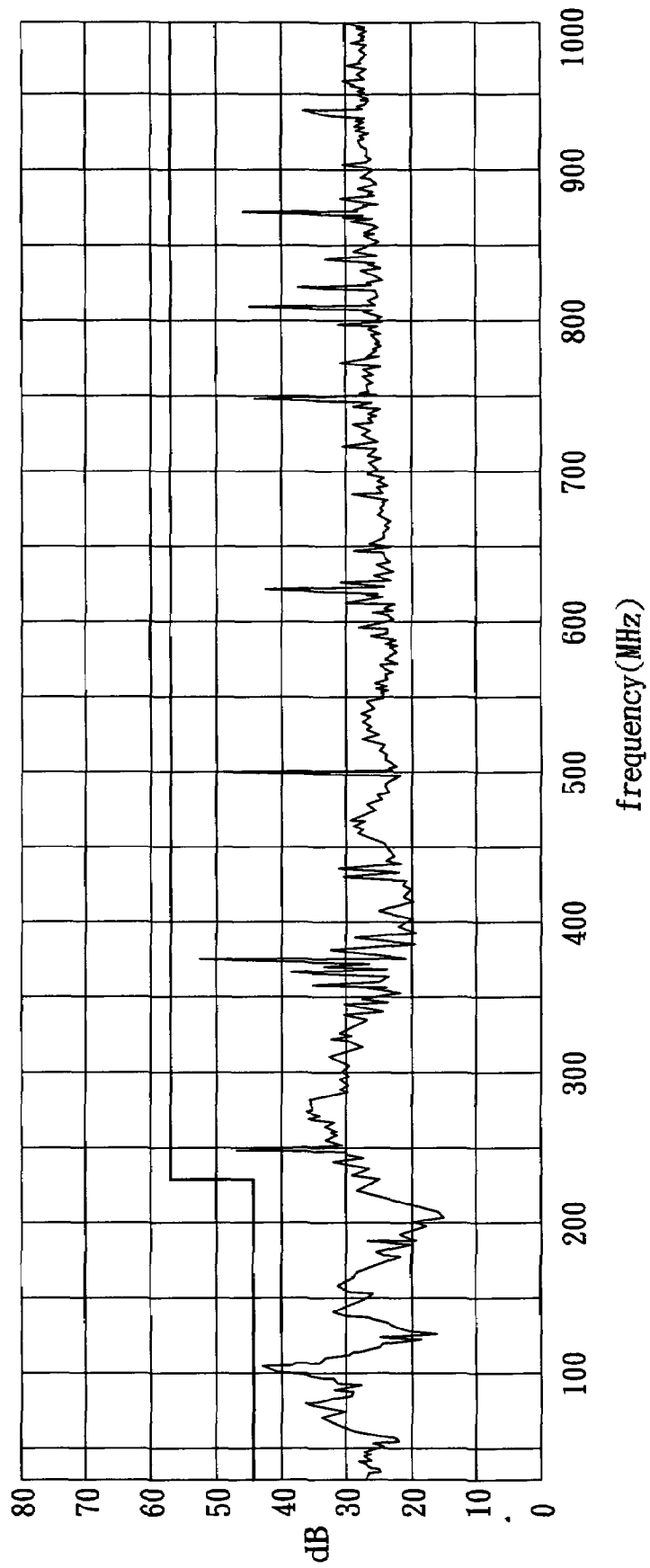
FIG. 3c is an electromagnetic interfering performance diagram of a machine having the cooling element in FIG. 3a disposed therein.
Figure 6:
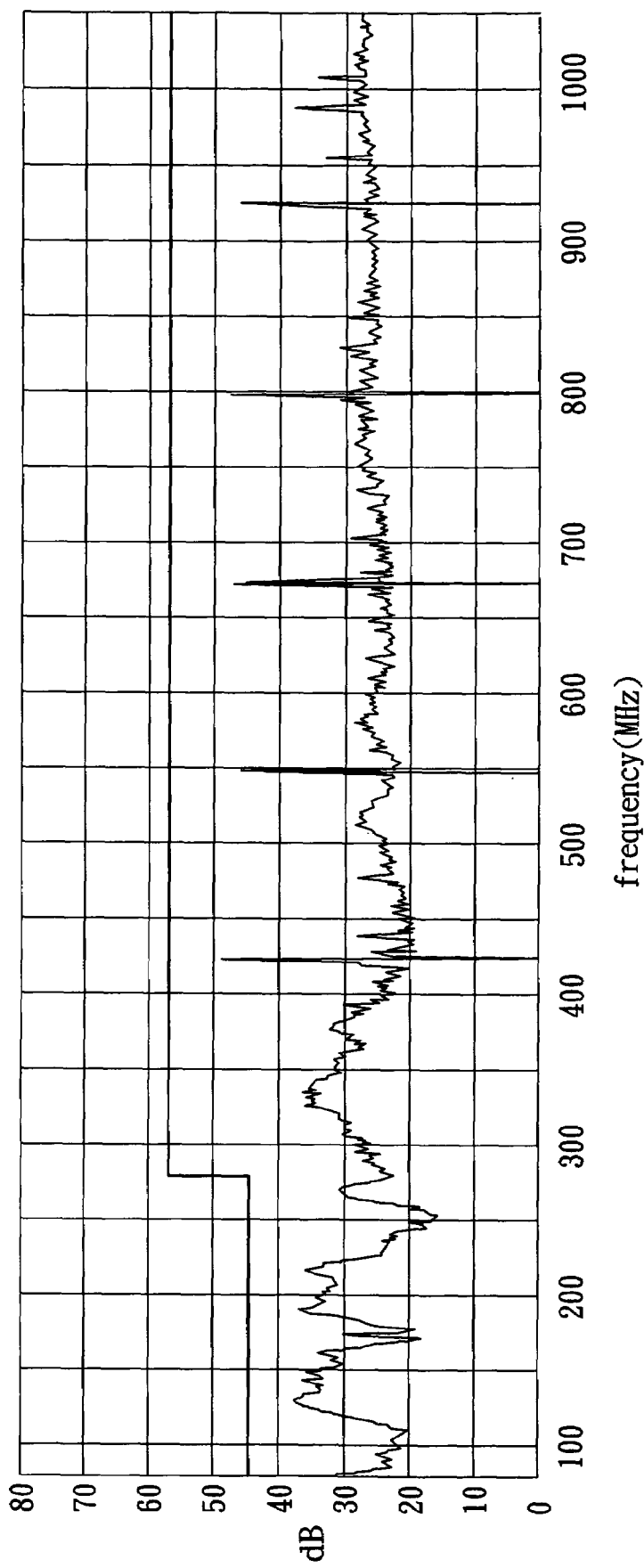
FIG. 6 is an electromagnetic interfering performance diagram of the machine without the cooling element.

Please refer to FIG. 3c illustrating an electromagnetic interfering performance diagram of the first preferred embodiment of the cooling element 21 having a length of 14 cm being disposed in a machine. Please further refer to FIG. 6 illustrating an electromagnetic interfering performance of the machine without the cooling element 21. Hence, by comparing the two Figures, it is apparent that the machine disposed with the cooling element 21 outperforms the machine without the cooling element since, while both machines being operated at the identical frequencies, e.g. 374.35, 499.48, 624.61, 749.74, 874.87 and 1000 MHz respectively, the over-limit values of the machine with the cooling element 21 are −6.74, −7.9, −16.53, −14.99, −10.61 and −6.55 DBuV/m, and the over-limit values of the machine disposed without the cooling element 21 are −10.9, −13.97, −11.35, −10.86, −13.02 and −6.71 DBuV/m.

Figure 4A:
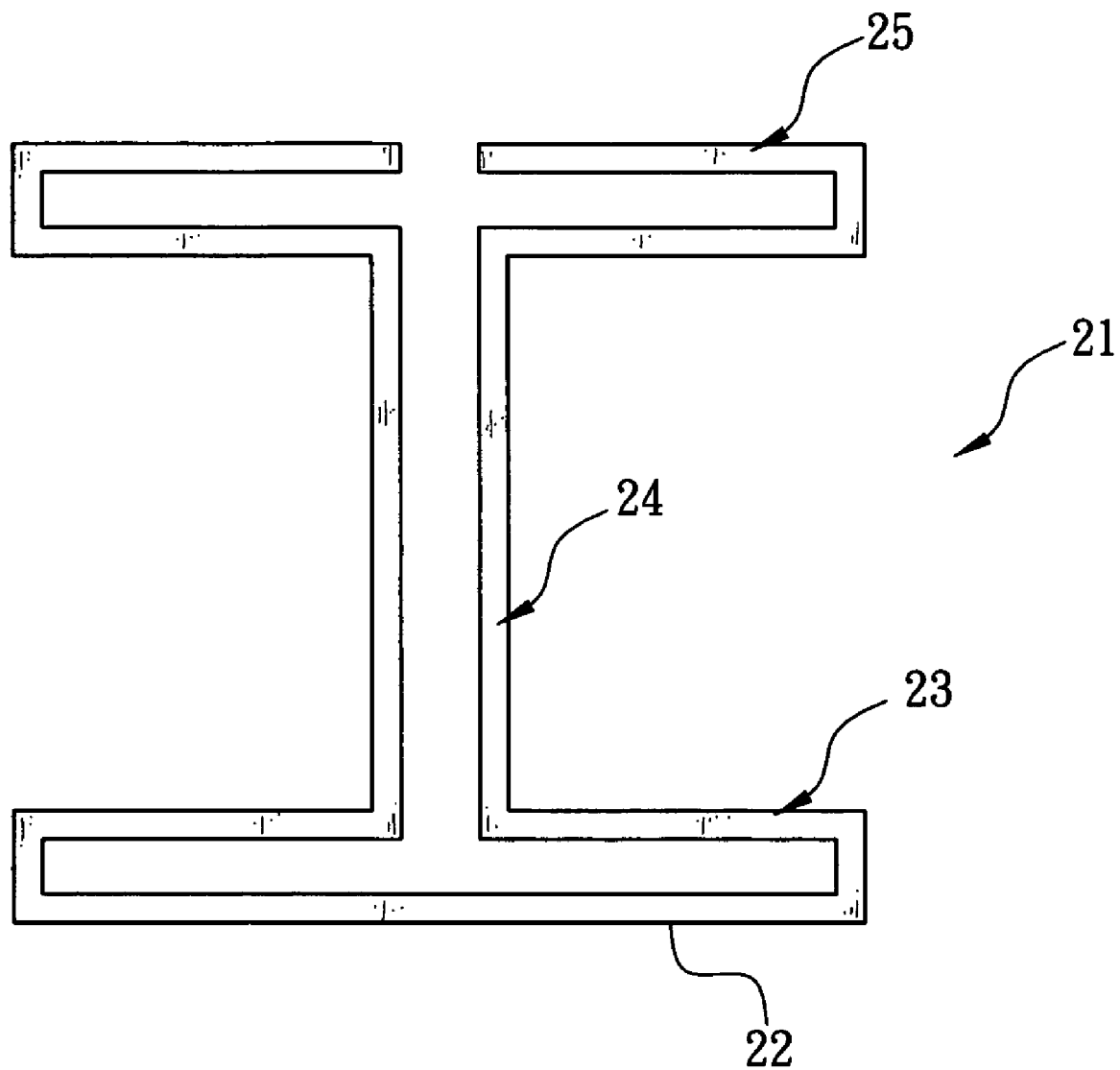
FIG. 4a is a schematic view showing the structure of a cooling element in the second preferred embodiment of the present invention.

Furthermore, please refer to a cooling element according to a second preferred embodiment of the present invention as shown in FIG. 4a, which has an improved structure with respect to the dissipation part 25 in the first preferred embodiment. After both free ends of the plate 22 extend upwardly a height from where two free ends face reversely as shown in the first preferred embodiment, both free ends then again horizontally extend a length to confront each other. Therefore, the plate 22 in the second preferred embodiment should have a length longer than that in the first preferred embodiment so as to increase the length of the dissipation part 25 for adjusting the capability of absorbing noises by the cooling element 21. Besides, by means of the improved structure of the dissipation part 25, when the noises absorbed by the cooling element 21 are transmitted along the paths through the extension part 24 to the dissipation part 25, the noises will eventually be mutually offset from each other in accordance with the symmetric structure of the dissipation part 25.

Figure 4B:
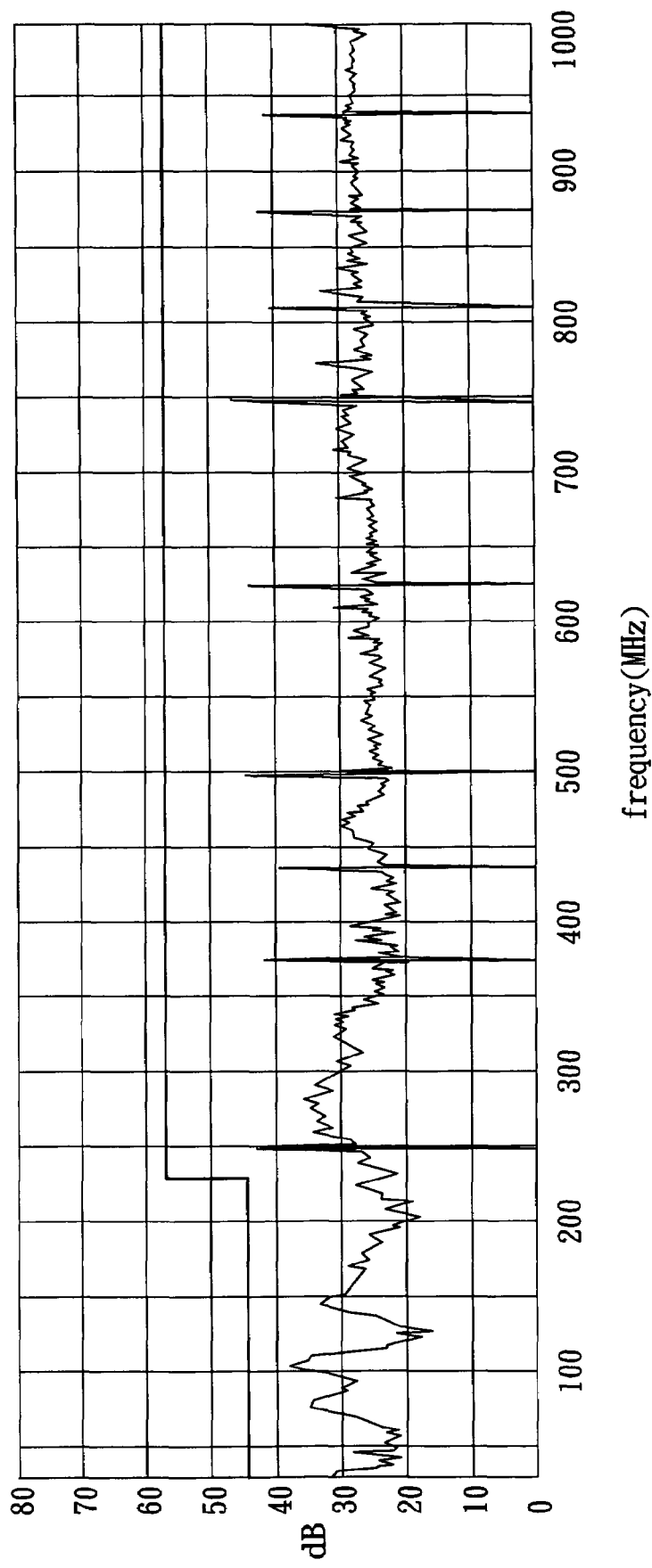
FIG. 4b is an electromagnetic interfering performance diagram of the machine having the cooling element in FIG. 4a disposed therein.

Please refer to FIG. 4b, which is the electromagnetic interfering performance diagram for a machine disposed with the cooling element 21 in the second preferred embodiment having a length of 18 cm. From the diagram, it is apparent that, when the machine is operated at the working frequencies of 374.35, 499.48, 624.61, 749.74, 874.87 and 1000 MHz respectively, the over-limit values of the machine disposed with the cooling element 21 are −15.61, −12.81, −13.11, −11.220, −17.11 and −10.83 DBuV/m. Accordingly, the machine according to the second preferred embodiment still outperforms the machine without the cooling element as illustrated in FIG. 6. As noted, the performances of the machine in the second embodiment operated are even better than that of the machine in the first embodiment at high frequencies (e.g. 874.87 and 1000 MHz) and at low frequencies (e.g. 374.35 and 499.4 MHz).

Figure 5:
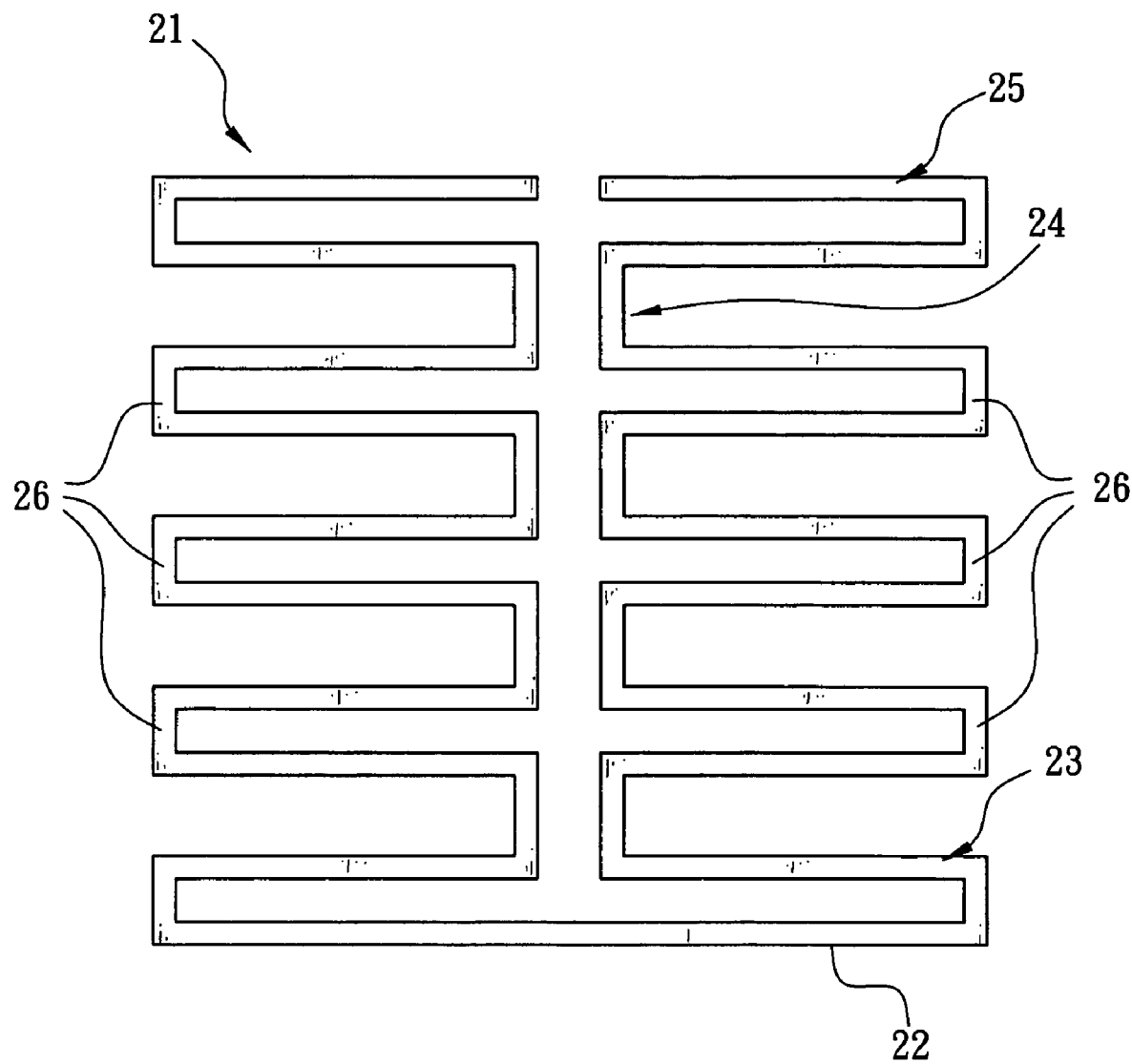
FIG. 5 is a schematic view of a cooling element in the third preferred embodiment of the present invention.

Please refer to a cooling element according to a third preferred embodiment of the present invention as shown in FIG. 5, which has an improved structure with respect to the extension part 24 in the second preferred embodiment. When both free ends of the plate 22 extend upwardly a height from where two free ends confronting each other as shown in the second preferred embodiment, both free ends again horizontally extend a length in a direction departing from each other. Then, both free ends of the plate 22 rise up a height and again horizontally extend a distance to confront each other so as to form an offset part 26 along the extension part 24. By using the same bending skill as mentioned above, at least one offset part 26 will be symmetrically formed on the extension part 24 between the contact part 23 and the dissipation part 25, there are three offset parts 26 in the third preferred embodiment. As a consequence, it only needs to increase the length of the plate 22 in order to form additional offset part 26 on the extension part 24 in accordance with the actual demand without changing the overall size thereof, so as to vary the frequency of the noise absorbed and eliminated by the cooling element 21. Meanwhile, the heat can also be dissipated to the air more efficiently by means of the offset part 26.

Please further refer to FIG. 5. Depending on the actual need for varying the frequency of the noise being absorbed, a plurality of offset parts 26 can be symmetrically formed one by one along the extension part 24 between the contact part 23 and the dissipation part 25, enabling the overall size of the cooling element 21 to be still maintained.

It has to mention here is that the above-mentioned structural designs of all the cooling elements described above allow thermal conductive glue 31 to be filled in a gap within the symmetric structures of the cooling elements. In addition to dissipating the heat of the cooling element 21, the heat can also be rapidly transferred to the cooling element 21 through the thermal conductive glue 31, such that the heat can be dissipated to the air more efficiently and the cooling element 21 can also be strengthened to stabilize and maintain the appearance of the cooling element 21.

While the invention herein disclosed has been described by means of specific embodiments, numerous modifications and variations could be made thereto by those skilled in the art without departing from the scope and spirit of the invention set forth in the claims.

The present invention is to provide a cooling element for eliminating electromagnetic noise, which is formed by bending a plate into a symmetric structure symmetrically comprising a contact part being in connect with an electronic component to absorb heat and noise radiated therefrom; an extension part having one end connected with said contact part to absorb heat and noise from said contact part; and a dissipation part connected with the other end of said extension part to absorb heat and noise from said extension part; wherein the noises absorbed by the cooling element are transmitted along the paths among the contact part, extension part and the dissipation part, and are mutually offset from each other in accordance with the symmetric structure thereof.

What is claimed is:

1. A cooling element for eliminating electromagnetic noise, formed by bending a plate into a symmetric structure symmetrically comprising:

a contact part formed by two ends of the plate extending upwardly and then horizontally extending to confront each other symmetrically, wherein said contact part in connection with an electronic component to absorb heat and noise radiated from said electronic component;

a first extension part formed by extending two free ends of said contact part upwardly;

a first offset part formed by extending two free ends of said first extension part horizontally extending depart from each, then upwardly, and then horizontally extending to confront each other symmetrically;

a second extension part formed by extending two free ends of said first offset part upwardly;

a second offset part formed by extending two free ends of said second extension part horizontally extending depart from each, then upwardly, and then horizontally extending to confront each other symmetrically;

a third extension part formed by extending two free ends of said second offset part upwardly; and a dissipation part connected with the free ends of said third extension part;

wherein the noises absorbed by the cooling element are transmitted along the contact part, said first extension part, said first offset part, said second extension part, said second offset part, said third extension part, and the dissipation part, and mutually offset from each other in accordance with an electromagnetic differential theory and the symmetric structure thereof.

2. The cooling plate of claim 1, wherein two free ends of the third extension part horizontally extending a length to depart from each other so as to form the dissipation part.

3. The cooling plate of claim 2, wherein two free ends of the dissipation part further extending upwardly a height and then horizontally extending a length to confront each other.

4. The cooling plate of claim 1, further symmetrically comprising a third offset part between the third extension part and the dissipation part.

5. The cooling plate of claim 2 further comprising a thermal conductive glue being filled in a gap within the symmetric structure of the cooling element.

6. The cooling plate of claim 3 further comprising a thermal conductive glue being filled in a gap within the symmetric structure of the cooling element.

7. The cooling plate of claim 4 further comprising a thermal conductive glue being filled in a gap within the symmetric structure of the cooling element.

* * * * *